United States Patent [19]

Konashinsky et al.

[11] 4,238,730
[45] Dec. 9, 1980

[54] MAGNETIC BRAKE-DAMPER OF ELECTRIC MEASURING INSTRUMENT

[76] Inventors: Jury A. Konashinsky, ulitsa Budennovskaya, 213, kv. 25; Alexandr V. Konashinsky, ulitsa Sverdlova, 48, kv. 5, both of Novocherkassk Rostovskoi oblasti, U.S.S.R.

[21] Appl. No.: 952,069

[22] Filed: Oct. 17, 1978

[51] Int. Cl.³ .............................................. G01R 1/16
[52] U.S. Cl. .................................................... 324/152
[58] Field of Search ......................................... 324/152

[56] References Cited

U.S. PATENT DOCUMENTS 2,353,618 7/1944 Lamb .................................... 324/152
3,588,768 6/1971 Baermann ....................... 324/152 UX

OTHER PUBLICATIONS

A. M. Ilyukovich, "Electric Meters", Gosenergoizdat, Publishers, 1963, pp. 311-318.

Primary Examiner—Michael J. Tokar
Attorney, Agent, or Firm—Fleit & Jacobson

[57] ABSTRACT

A magnetic brake-damper of an electric measuring instrument comprises two similarly magnetized permanent magnets with opposite poles, arranged one above the other and forming a gap accommodating part of the moving element of the instrument. Both permanent magnets are arranged so that the vector of their magnetization is parallel to the surface of the part of the moving element, accommodated in the gap.

3 Claims, 6 Drawing Figures

MAGNETIC BRAKE-DAMPER OF ELECTRIC MEASURING INSTRUMENT

FIELD OF THE INVENTION

The present invention relates to electric measuring instruments, and, more particularly, to a magnetic brake-damper of an electric measuring instrument.

Magnetic brake-dampers are used to create a braking moment proportional to the rotational speed of the moving part of an induction meter, e.g. the disc of an electricity meter, as well as to damp the motion of moving elements of other types of measuring instruments.

BACKGROUND OF THE INVENTION

The operating principle of magnetic brake-dampers is based on interaction of the magnetic flux created by a permanent magnet with the electric current induced by this flux in the moving element of an instrument. The prior art magnetic brake-dampers do create the necessary braking and damping moments. However, the pronounced magnetic leakage from the surface of the employed permanent magnets sharply reduces the working magnetic flux creating a breaking or damping moment. This results in high consumption of magnetic materials for permanent magnets and also results in magnetic brake-dampers becoming quite cumbersome. The increasingly stringent requirements for the output parameters of magnetic brake-dampers and greater output of instruments in which they are used necessitate optimized designs characterized by smaller sizes and lower magnetic material consumption.

There is known a magnetic brake-damper of an electric measuring instrument (cf. A.M. Ilyukovich, Electric Meters, "Gosenergoizdat" Publishers, 1963, p. 314/in Russian/), comprising a dipole cylindrical permanent magnet. One of the end faces of the cylinder has a diametral slot, and the resulting projections on either side thereof serve as magnet poles. There is also provided a flat magnetic core arranged above the poles of the permanent magnet with a gap therebetween, accommodating part of the electric meter disc.

The magnetic flux is thermally compensated by a plate of a thermomagnetic material, placed between the poles of the permanent magnet.

The above magnetic brake-damper has an extended, as compared to the pole area, side surface normal to the plane of the disc, resulting in a large leakage flux not contributing to creating a braking moment, which necessitates a large magnet to create the required braking moment.

Also known is a magnetic brake-damper of an electric measuring instrument, comprising two similarly magnetized permanent magnets with opposite poles, arranged one above the other and forming a gap accommodating part of the moving element of the instrument (cf. A.M. Ilyukovich, Electric Meters, "Gosenergoizdat" Publishers, 1963, p. 316/in Russian/).

In this magnetic brake-damper, used as a means for closing the magnetic flux, there is included a cylindrical permanent magnet with a diametral slot made on one of its end faces. Both magnets are magnetized along an arc in the same direction and are normal to the moving element plane. The magnetic flux is thermally compensated by means of a plate of a thermomagnetic material, disposed between the magnet poles.

The configurational complexity of the magnets with curvilinear magnetization and the extended area of their side surfaces, responsible for a large leakage flux which does not participate in creating a braking moment, increase the size and magnetic material consumption of said magnetic brake-damper.

SUMMARY OF THE INVENTION

It is, therefore, an object of the present invention to provide a magnetic brake-damper of an electric measuring instrument, reduced in size.

Another object of the invention is to simplify the configuration of the permanent magnets used therein and to minimize the magnetic material consumption.

The invention essentially resides in that, in a magnetic brake-damper of an electric measuring instrument, comprising two similarly magnetized permanent magnets with opposite poles, arranged one above the other and forming a gap accommodating part of a moving element of the electric measuring instrument, according to the invention, the permanent magnets are arranged so that the vector of their magnetization is parallel to the surface of the part of the moving element accommodated in the gap.

The proposed magnetic brake-damper permits permanent magnets to be arranged and magnetized in a direction parallel to the moving element of the electric measuring instrument. This enables the magnetic material consumption to be reduced 1.5 to 2 times as compared to prior art devices.

BRIEF DESCRIPTION OF THE ACCOMPANYING DRAWINGS

The invention will now be described in greater detail with reference to specific embodiments thereof, taken in conjunction with the accompanying drawings, wherein.

DETAILED DESCRIPTION OF THE INVENTION

Figure 1:
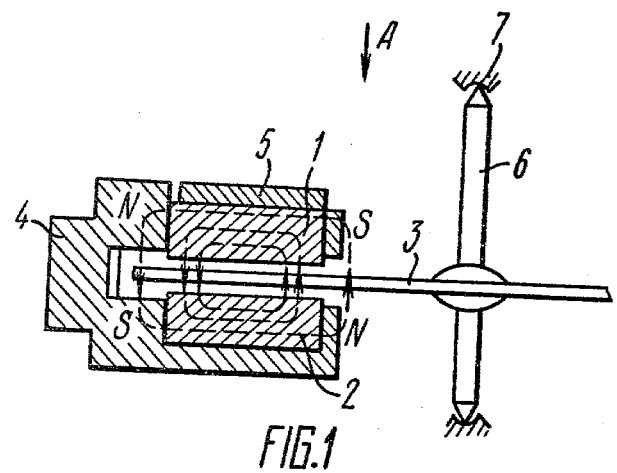
FIG. 1 is a longitudinal section view of a magnetic brake-damper in the case where the moving element is a disc, according to the invention.

The proposed magnetic brake-damper of an electric measuring instrument comprises a permanent magnet 1 (FIG. 1) spaced apart from another permanent magnet 2. The gap between both magnets accommodates part of a moving element 3 of the electric measuring instrument (not shown). The permanent magnet 1 is housed in a case 4 of a nonmagnetic material, which also accommodates the other magnet 2. Both magnets 1 and 2 are arranged so that the vector of their magnetization is parallel to the surface of the part of the moving element 3, accommodated in the gap, and is labelled N-S.

For thermal compensation of variations in the magnetic flux, provision is made for a plate 5 of a thermomagnetic material, rigidly attached to the permanent magnet 1.

The moving element 3 of the measuring instrument is secured on a shaft 6 mounted in ball sockets 7 and 7'.

The direction of the magnetic flux is indicated by dashed lines with arrows.

Figure 2:
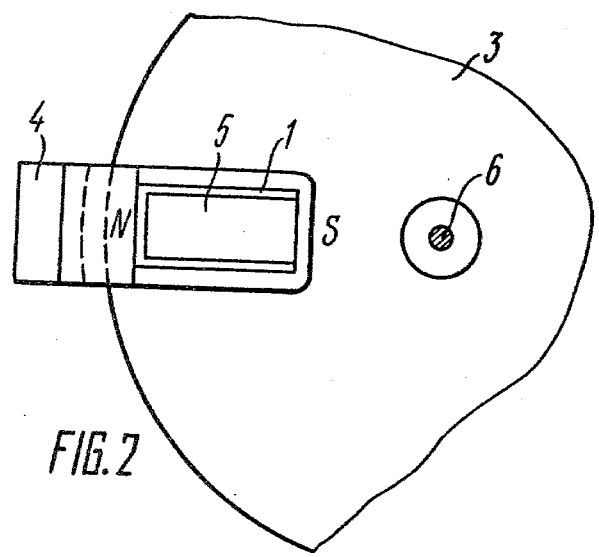
FIG. 2 is a view taken along arrow A in FIG. 1.

The permanent magnet 1 (FIG. 2) is of a rectangular shape, and the shape of the other magnet (not shown in FIG. 2) is similar.

Figure 3:
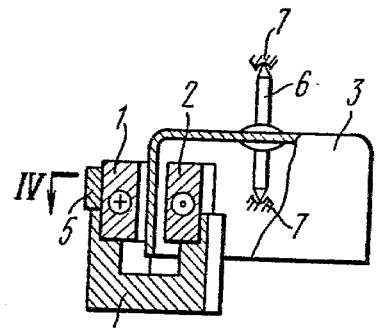
FIG. 3 is a longitudinal section view of a magnetic brake-damper in the case where the moving element is a short cylindrical member, according to the invention.
Figure 4:
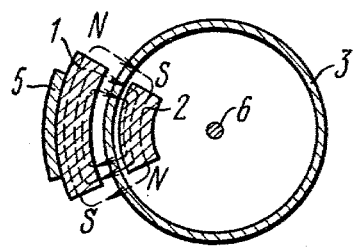
FIG. 4 is a sectional view taken along line IV—IV of FIG. 3.

In an alternative embodiment, the permanent magnet 1 (FIG. 3) may be shaped as a segment. This shape is determined by the configuration of the moving element 3 of the measuring instrument, which, in this case, is a short cylindrical member. The other magnet 2 (FIG. 4) is also shaped as a segment. Owing to this shape of the magnets 1 and 2, the vector of their magnetization is parallel to the surface of that part of the moving element, which is in the gap. The magnetization vector is labelled N-S, and the direction of the magnetic flux is shown by dashed lines with arrows.

Figure 5:
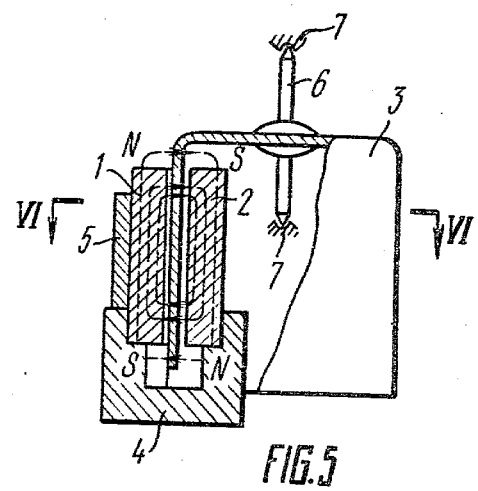
FIG. 5 is a longitudinal section view of a magnetic brake-damper in the case where the moving element is a long cylindrical member, according to the invention.
Figure 6:
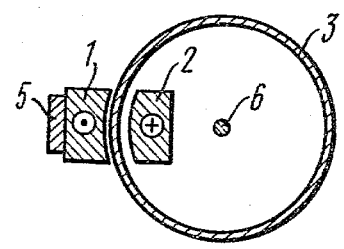
FIG. 6 is a sectional view taken along line VI—VI of FIG. 5.

Still another embodiment of the magnetic brake-damper is possible for the case where the moving element 3 (FIG. 5) of the measuring instrument is made as a long cylindrical member. In this case, the permanent magnets 1 and 2 are magnetized rectilinearly. Owing to this shape of the magnets 1 and 2, the vector of their magnetization is parallel to the surface of that part of the moving element, which is in the gap. This vector is labelled N-S, and the magnetic flux direction is shown by dashed lines with arrows. In this case, the profile of the magnets 1 and 2 (FIG. 6) follows the shape of the surface of the moving element made as a long cylindrical member.

The proposed magnetic brake-damper operates as follows:

The magnetic flux emerging practically from any portion of the permanent magnets 1 (FIG. 1) and 2 intersects the moving element 3 twice, thereby creating a braking moment, this feature ensuring small size of the device and minimum consumption of the magnetic material. As the element 3 moves in the magnetic field of the permanent magnets 1 and 2, in accordance with the Faraday law of induction, an electromotive force appears in the body of the moving element 3, with Foucault currents being induced therein. In accordance with the Biot-Savart-Laplace law, interaction of the electric current with the magnetic field of the permanent magnets 1 and 2 results in an electromotive force which creates a braking moment. In view of the fact that the magnitude of the induced currents is proportional to the speed of motion of the moving element 3 and that the magnetic field created by the magnets 1 and 2 is permanent, the created braking moment is proportional to the speed of the moving element 3 and directed opposite to the moment causing the moving element 3 to rotate, whereby the latter is braked.

What is claimed is:

1. A magnetic brake-damper of an electric measuring instrument having a moving element which is secured on a shaft having a rotational axis and adapted to rotate in ball sockets, said moving element having a portion which is parallel to said rotational axis of said shaft, said magnetic brake-damper comprising:

a first permanent magnet shaped as a segment with opposite poles defining lines of force parallel to said rotational axis of said shaft;

a case of non-magnetic material for housing said first permanent magnet;

a second permanent magnet shaped as a segment with opposite poles defining lines of force parallel to said rotational axis of said shaft, accommodated in said case with said first permanent magnet and similarly magnetized;

said permanent magnets being spaced apart to form a gap accommodating said portion of said moving element;

said permanent magnets being so magnetized that the vector of their magnetization is parallel to the surface of said portion of said moving element of said electric measuring instrument and parallel to said rotational axis of said shaft, while the surfaces of the poles of the said magnets are not disposed in the plane which is parallel to the said surface of the moving element.

2. The magnetic brake-damper of claim 1, wherein said moving element comprises a short cylindrical member and said segment is correspondingly shaped.

3. The magnetic brake-damper of claim 1, wherein said moving element comprises a long cylindrical member and said segment is correspondingly shaped.

* * * * *